(12) United States Patent
Ma et al.

(10) Patent No.: US 7,694,723 B2
(45) Date of Patent: Apr. 13, 2010

(54) WATER BLOCK

(75) Inventors: Hsiao-Kang Ma, 7F., No. 38, Lane 151, Sec.4, Ren-ai Rd., Da-an District, Taipei, 106 (TW); Chang-Hung Peng, Chung-Ho (TW); Bo-Ren Hou, Yonghe (TW); Ming-Chien Kuo, Chung-Ho (TW)

(73) Assignees: Cooler Master Co., Ltd., Taipei (TW); Hsiao-Kang Ma, Taipei (TW)

( * ) Notice: Subject to any disclaimer, the term of this patent is extended or adjusted under 35 U.S.C. 154(b) by 246 days.

(21) Appl. No.: 11/782,084

(22) Filed: Jul. 24, 2007

(65) Prior Publication Data

US 2008/0236793 A1  Oct. 2, 2008

(30) Foreign Application Priority Data

Mar. 30, 2007  (TW) .............................. 96111222 A (51) Int. Cl.
*H05K 7/20* (2006.01)
(52) U.S. Cl. ........................ 165/80.4; 165/120; 361/699
(58) Field of Classification Search ................ 165/80.4, 165/120; 361/699; 417/413.1, 413.2
See application file for complete search history.

(56) References Cited

U.S. PATENT DOCUMENTS

| | | | | |
|---|---|---|---|---|
| 4,636,149 A | * | 1/1987 | Brown | 417/322 |
| 5,542,821 A | * | 8/1996 | Dugan | 417/53 |
| 5,901,037 A | * | 5/1999 | Hamilton et al. | 361/699 |
| 5,914,856 A | * | 6/1999 | Morton et al. | 361/690 |
| 6,074,178 A | * | 6/2000 | Bishop et al. | 417/322 |
| 6,109,889 A | * | 8/2000 | Zengerle et al. | 417/413.2 |
| 6,230,791 B1 | * | 5/2001 | Van Dine et al. | 165/80.4 |
| 6,232,680 B1 | * | 5/2001 | Bae et al. | 310/17 |
| 6,368,079 B2 | * | 4/2002 | Peters et al. | 417/413.2 |
| 6,501,654 B2 | * | 12/2002 | O'Connor et al. | 361/699 |
| 7,084,004 B2 | * | 8/2006 | Vaiyapuri et al. | 438/106 |
| 7,126,822 B2 | * | 10/2006 | Hu et al. | 361/699 |
| 7,198,250 B2 | * | 4/2007 | East | 251/129.06 |
| 7,486,515 B2 | * | 2/2009 | Brandenburg et al. | 361/703 |
| 2004/0037035 A1 | * | 2/2004 | Ohashi et al. | 361/687 |
| 2005/0089415 A1 | * | 4/2005 | Cho et al. | 417/413.2 |
| 2007/0017659 A1 | * | 1/2007 | Brunschwiler et al. | 165/80.4 |
| 2007/0020124 A1 | * | 1/2007 | Singhal et al. | 417/413.2 |
| 2007/0065308 A1 | * | 3/2007 | Yamamoto et al. | 417/413.1 |
| 2007/0295481 A1 | * | 12/2007 | Campbell et al. | 165/80.4 |

* cited by examiner

*Primary Examiner*—Allen J Flanigan
(74) *Attorney, Agent, or Firm*—Chun-Ming Shih (57) ABSTRACT

A water block is used to be adhered to a heat-generating element and includes a cavity. The cavity has a chamber therein. One side or both sides of the chamber is provided with an inlet pipeline and an outlet pipeline respectively, thereby communicating with the chamber. Further, the chamber is provided therein with a heat-exchanging means for performing a heat-exchanging action with a working fluid. Finally, the top face of the cavity is provided with a membrane. An activating element is adhered on the membrane for driving the membrane to swing up and down, thereby forcing the working fluid within the chamber to circulate in single direction. The activating element is used as a power source, and in addition, the water block can be made much thinner.

14 Claims, 9 Drawing Sheets

WATER BLOCK

BACKGROUND OF THE INVENTION

1. Field of the Invention

The present invention relates to a heat-dissipating structure, and in particular to a water block that is adhered to a heat-generating element.

2. Description of Prior Art

Since the products made by modern technology are developed to a more precise extent, the volume thereof is more and more miniaturized but the heat generated is increasing substantially. Especially in a computer, since the operational performance thereof is enhanced continuously, the number of peripheral electronic components increases and thus the amount of heat generated by the whole computer also increases to a substantial extent. Therefore, in order to make the computer to operate normally in an allowable range of working temperature, it is necessary to provide an additional heat-dissipating device to reduce the influence of the heat exerted on the operation of computer.

Among current heat-dissipating devices, the fan is a kind of heat-dissipating device that is simplest and most commonly used. The other way of heat dissipation that is most commonly used is a water-cooling heat-dissipating system. The water-cooling heat-dissipating system utilizes a water block that is adhered on a heat-generating element (such as a CPU or disc driver). Via a pump, a cooling liquid is drawn from a water tank and is introduced into the water block. After the cooling liquid performs a heat-exchanging action with the water block that has absorbed heat from the heat-generating element, the cooling liquid flows from the water block to a heat-dissipating module, and is delivered back to the water tank after being cooled. The circulation of the cooling liquid facilitates to dissipate the heat and lowers the temperature of the heat-generating element. In this way, the whole computer can operate smoothly.

In addition to a necessary water block, the conventional heat-dissipating system also includes a pump, a water tank and a water cooler. All components are connected and communicated with each other via conduits, so that a working fluid can flow among each component.

In order to solve the problem of limited space, in the conventional art, the water block and the pump of the water-cooling heat-dissipating system are combined with each other, so that the water block can not only absorb the heat, but also generate a thrust for driving the working fluid. Via this arrangement, the necessary volume of the water-cooling heat-dissipating system can be reduced. However, under a condition that the traditional pump uses a set of fan blades as a power source, although the water block and the pump are combined together to reduce one component, the combined structure of the water block still cannot reduce the volume substantially. In order to meet the demands of electronic products for the water-cooling heat-dissipating system, it is an important issue to propose another solution to overcome the above problems existed in prior art.

SUMMARY OF THE INVENTION

In view of the above drawbacks, the present invention is to provide a water block that uses an activating element as a power source. The top of the water block is provided with an activating element that swings up and down at one side, thereby compressing the space within the water block. In this way, not only the working fluid can enter or exit the water block via the activating element, but also the water block can be made much thinner.

The present invention provides a water block including a cavity. The cavity has a chamber therein. One side or both sides of the chamber is provided with an inlet pipeline and an outlet pipeline respectively, thereby communicating with the chamber. Further, the chamber is provided therein with a heat-exchanging means for performing a heat-exchanging action with a working fluid. Finally, the top of the cavity is provided with a membrane. An activating element is adhered on the membrane for driving the membrane to swing up and down, thereby forcing the working fluid within the chamber to circulate in single direction.

DETAILED DESCRIPTION OF THE INVENTION

The technical contents of the present invention will be described with reference to the accompanying drawings.

Figure 1:
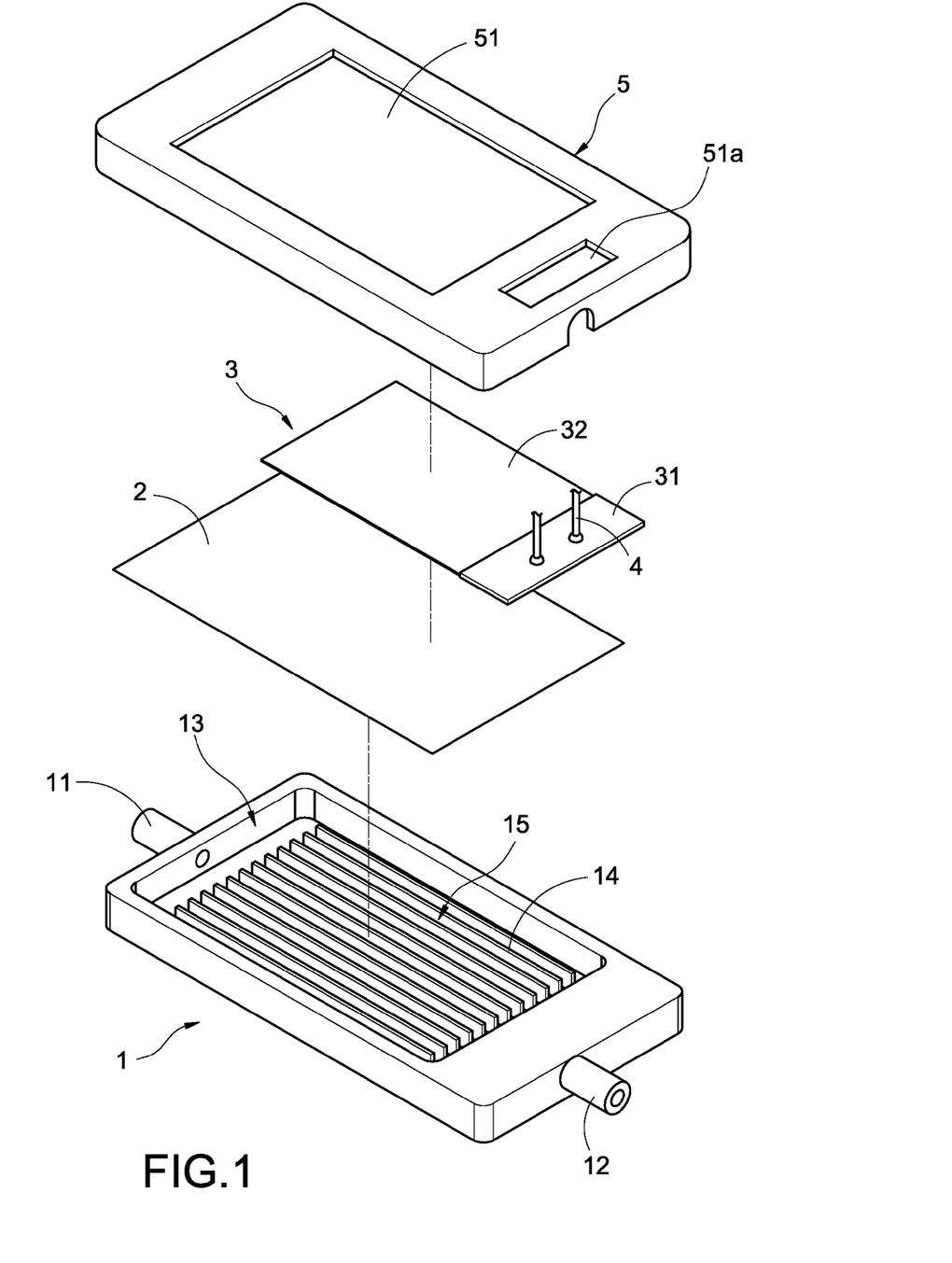
FIG. 1 is an exploded view showing the structure of the present invention.
Figure 2:
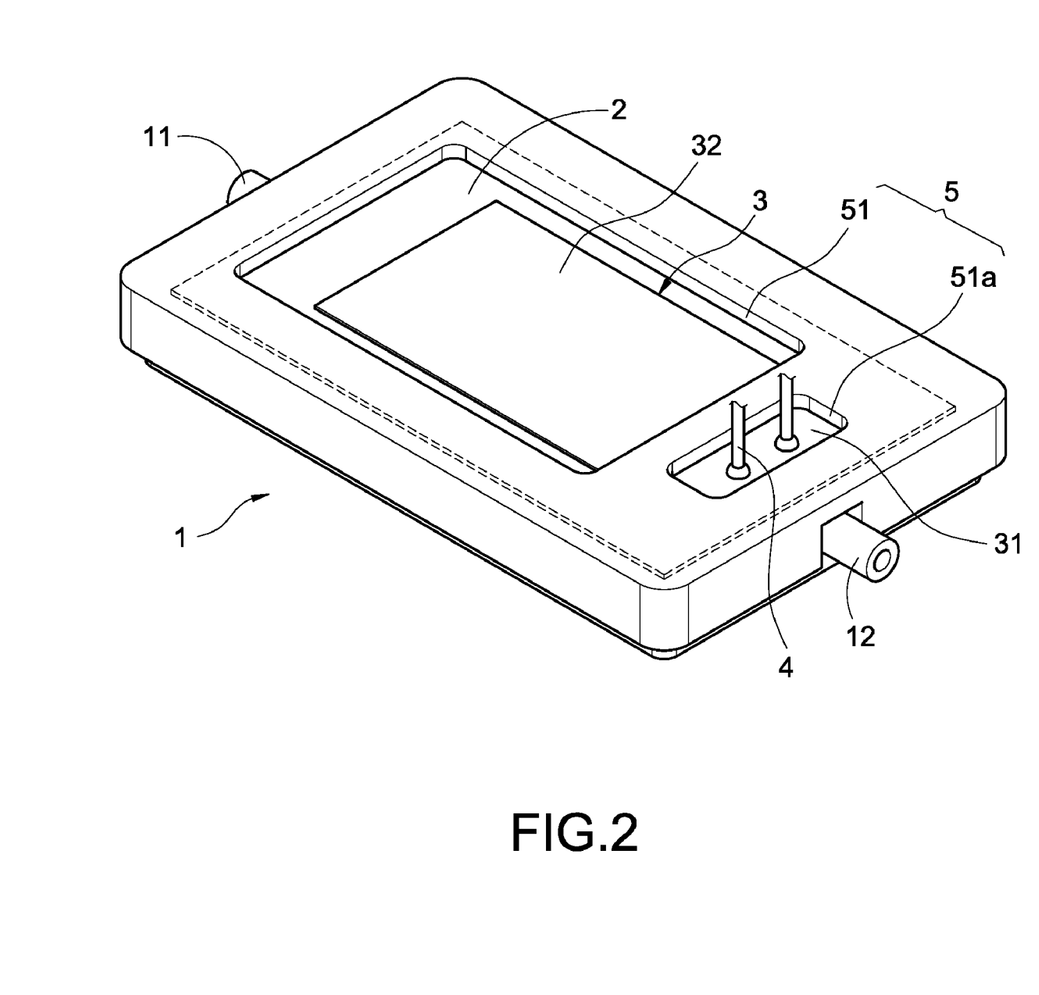
FIG. 2 is an assembled view showing the structure of the present invention.

FIG. 1 and FIG. 2 are an exploded perspective view and an assembled view showing the structure of the present invention respectively. As shown in these figures, the water block of the present invention is mainly constituted of a cavity 1. Left and right sides of the cavity 1 are provided with an inlet pipeline 11 and an outlet pipeline 12 respectively. The interior of the cavity 1 is provided with a camber 13 that is communicated with the inlet pipeline 11 and the outlet pipeline 12 respectively. Further, the chamber 13 is provided therein with a heat-exchanging means 14 that is constituted of a plurality of heat-dissipating fins arranged at intervals. Any two neighboring heat-dissipating fins form a heat-dissipating pathway 15.

Figure 9:
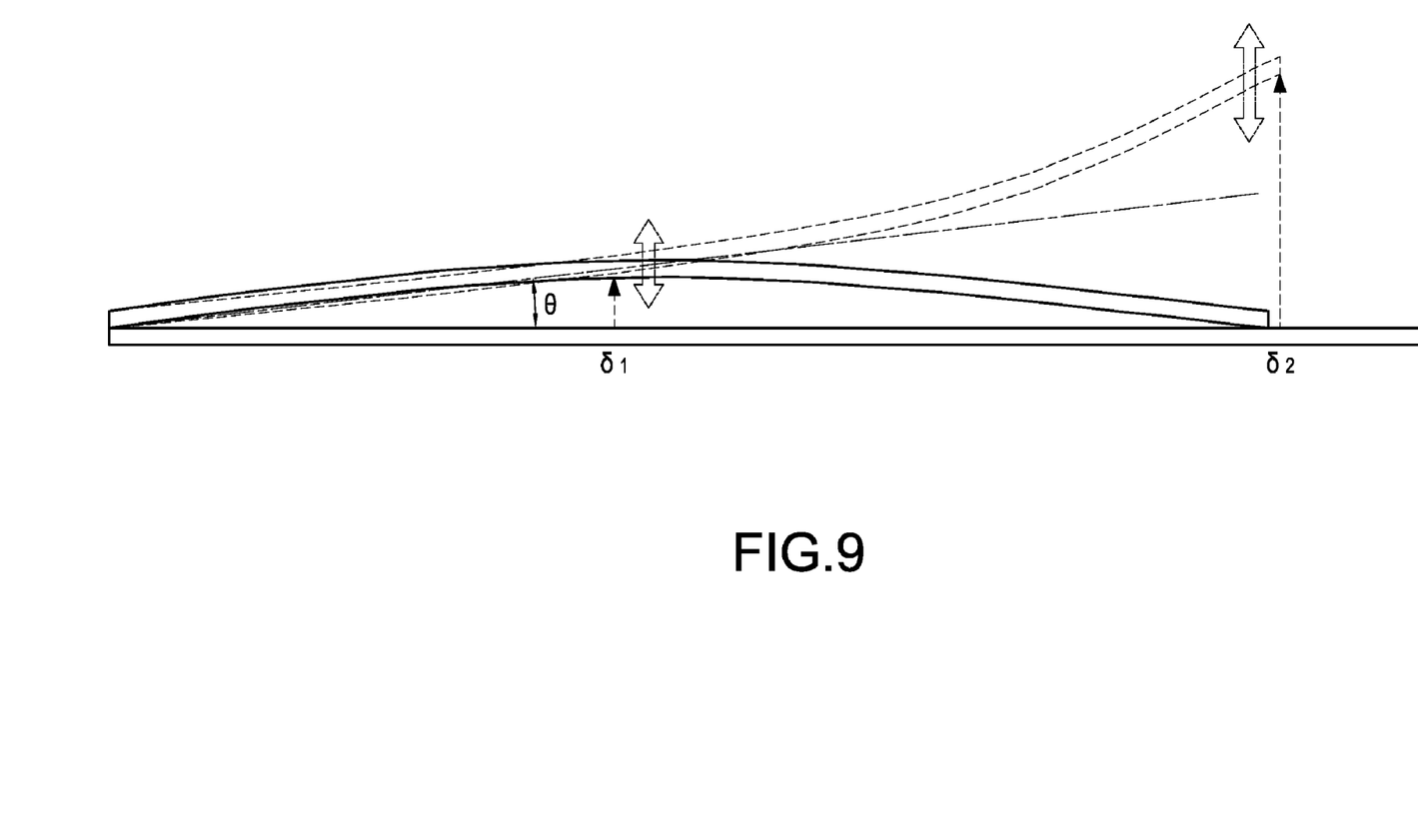
FIG. 9 is a schematic view showing the comparison between the swinging actions generated by the membranes of the present invention and prior art.

Please refer to FIG. 1 again. The upper end face of the cavity 1 is provided with a membrane 2 that is made of materials having a high tension. The size of the membrane 2 is slightly identical to the area of the upper end face of the cavity 1, thereby covering the chamber 13 completely. An activating element 3 is provided above the membrane 2. In the present embodiment, the activating element 3 is a piezoelectric piece that is provided above the chamber 13 correspondingly and is adhered to the membrane 2. The activating element 3 has a fixed end 31 and a swinging end 32. The fixed end 31 is located on the same side as the outlet pipeline 12. The fixed end 31 is connected with a plurality of electrode leads 4, thereby providing the necessary electricity for the activating element 3. The swinging end 32 is adhered onto the surface of the membrane 2. After being supplied with electricity, the swinging end 32 generates a swinging action along an arc-shaped trajectory at one side. As shown in FIG. 9, under the same swinging angle θ, the amount of deformation δ2 obtained by swinging along an arc-shaped trajectory is further larger than the amount of deformation δ1 obtained by swinging in the middle section. In addition, the swinging frequency of the activating element 4 can be adjusted according to different demands.

Finally, the cavity 1 can be also combined with a casing 5, thereby covering the above-mentioned membrane 2 and the activating element 3. The casing 5 is provided with a plurality of penetrating troughs 51, 51a thereon that correspond to the activating element 3 and the electrode leads 4 respectively. The penetrating troughs allow the activating element 3 to be exposed to the outside to have a space for expansion. The activating element 3 is also penetrated by the electrode leads 4. The completely assembled view is shown in FIG. 2.

Figure 3:
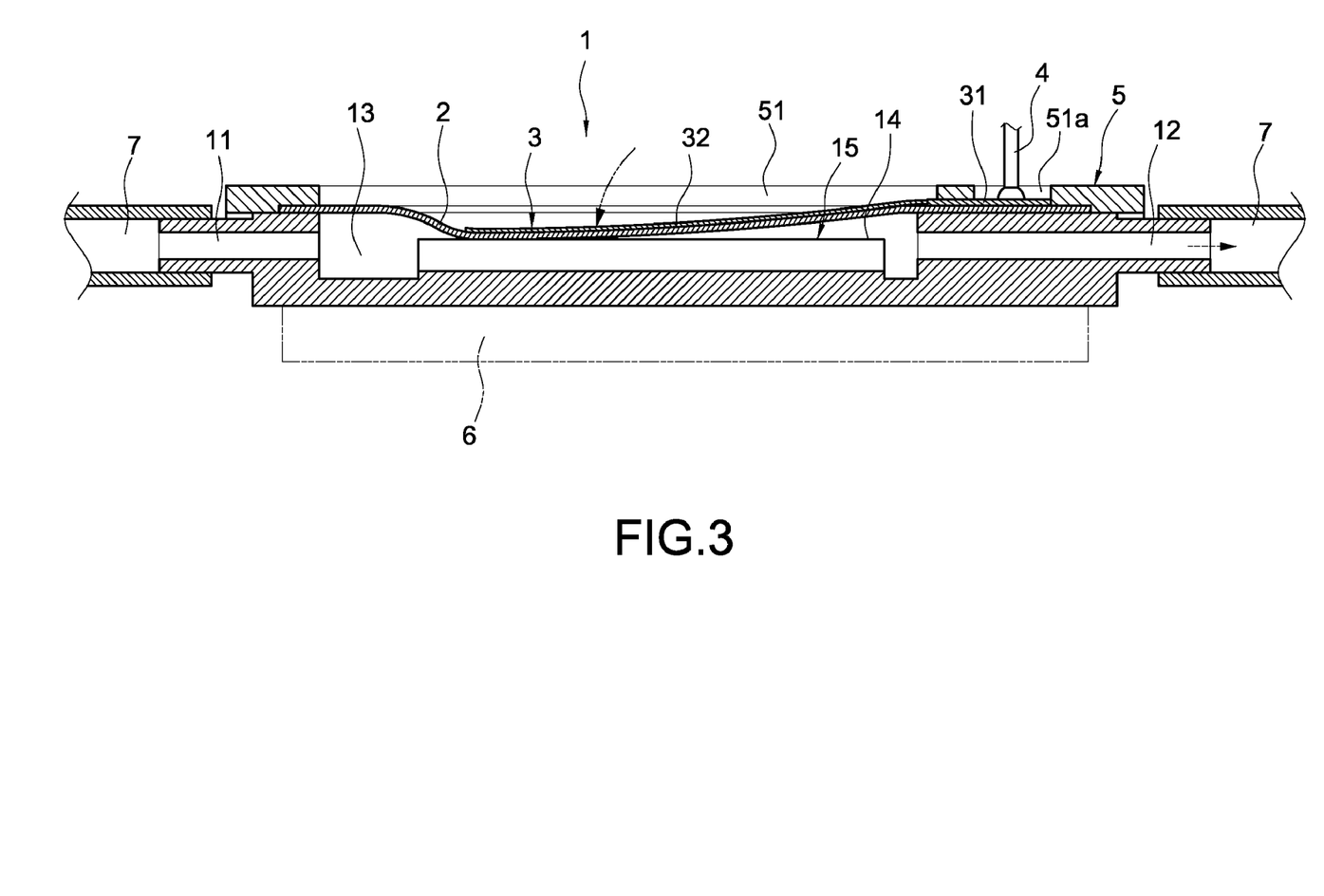
FIG. 3 is a cross-sectional view (I) showing the operation of the present invention.
Figure 4:
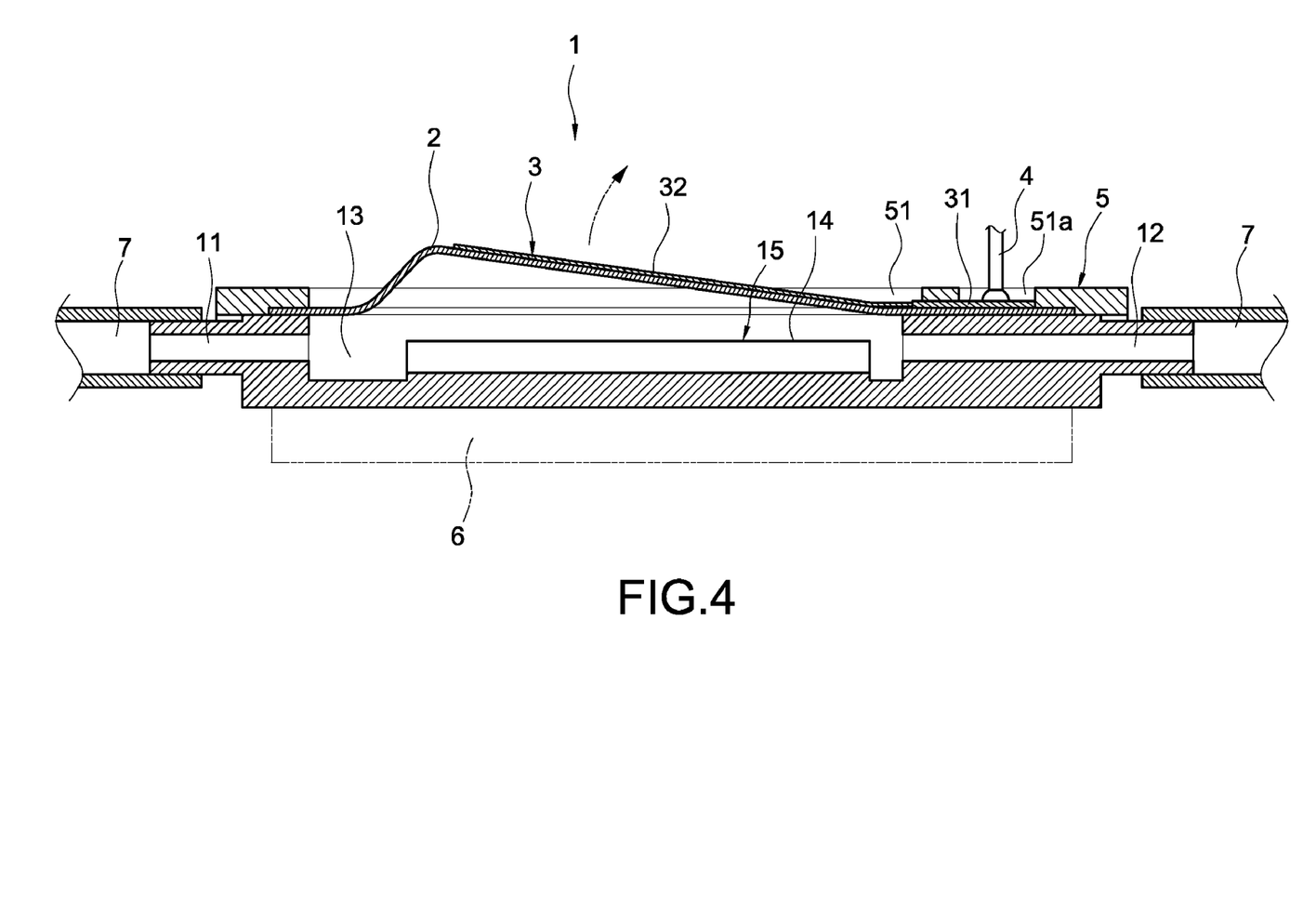
FIG. 4 is a cross-sectional view (II) showing the operation of the present invention.

With reference to FIGS. 3 and 4, they are cross-sectional views showing the operation of the present invention. As shown in these figures, the water block is adhered onto a heat-generating element 6. The inlet pipeline 11 and the outlet pipeline 12 are connected to conduits 7 of a water-cooling system respectively, so that the water block is communicated with other components included in the water-cooling system (not shown). In this way, a working fluid can enter the water block easily and perform a heat-exchanging action with the heat-exchanging means 14 that has absorbed heat in the water block. Therefore, the working fluid can take the heat source away. When a power supply conducts electricity to the activating element 3 via the leads 4, the swinging end 32 of the activating element 3 can generate a swinging action along an arc-shaped trajectory at one side, as shown in FIG. 3. When the swinging end 32 of the activating element 3 swings downwardly, the membrane 2 is driven to compress the internal space of the chamber 13 to generate a pressure. Via the swinging action along an arc-shaped trajectory, the working fluid can be concentrated to flow in the same direction. In this way, the working fluid can generate a thrust to flow out of the outlet pipeline 12 as indicated by the arrow. When the swinging end 32 of the activating element 3 swings upwardly as shown in FIG. 4, the membrane 2 recovers to its original shape to release the space within the chamber 13. In this way, the internal pressure of the chamber 13 is smaller than the external pressure, so that the working fluid enters the chamber 13 from the inlet pipeline 11 as indicated by the arrow. Via this arrangement, the water block has an effect like a pump to force the working fluid to enter and exit the water block rapidly, so that the working fluid can form a larger amount of flow in single direction.

Figure 5:
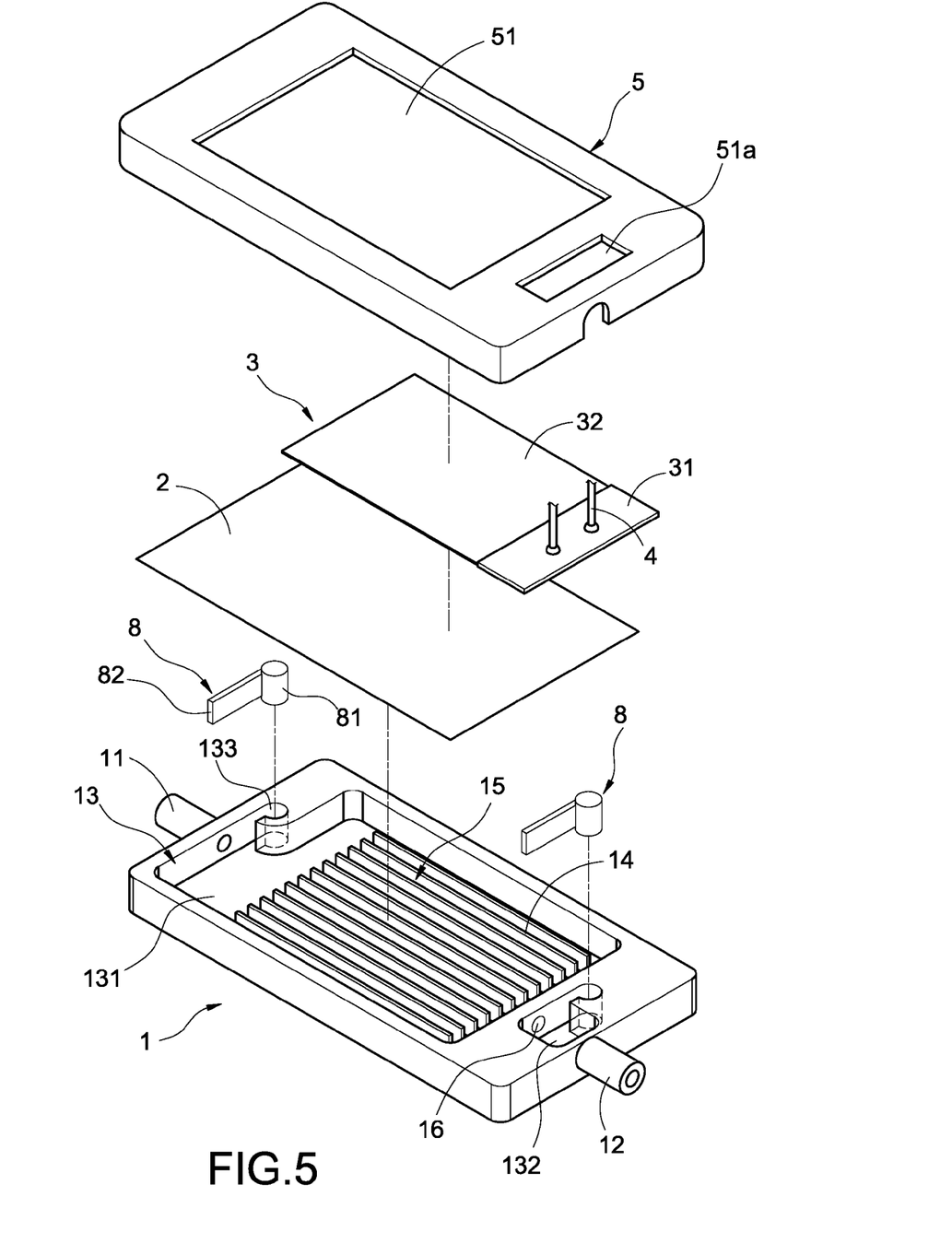
FIG. 5 is an exploded view showing the structure of a second embodiment of the present invention.

With reference to FIG. 5, it is an exploded view showing the structure of the second embodiment of the present invention. As shown in this figure, the water block 1 is mainly constituted of a cavity 1, in which an internal chamber 13 of the cavity 1 is divided into a first chamber 131 and a second chamber 132. In the present embodiment, the second chamber 132 is provided on one side of the first chamber 131. The first chamber and the second chamber are communicated with each other via a through hole 16. The cavity 1 has an inlet pipeline 11 and an outlet pipeline 12. The inlet pipeline 11 and the outlet pipeline 12 are communicated with the first chamber 131 and the second chamber 132 respectively. Further, the interior of the first chamber 131 is provided with a heat-exchanging means 14 that is constituted of a plurality of heat-dissipating fins arranged at intervals. A heat-dissipating pathway 15 is formed between any two heat-dissipating fins. Further, an inner wall face of the first chamber 131 is provided with a valve 8 at the position corresponding to the inlet pipeline 11. In the present embodiment, one end of the valve 8 is provided with a pillar 81 that penetrates into a penetrating trough 133 on the inner wall. A plate 82 extends from the pillar 81 and corresponds to the mouth of the inlet pipeline 11, thereby blocking the working fluid from flowing into the inlet pipeline 11 from the first chamber 131 to flow out of the cavity 1. Further, a valve 8a is provided on an inner wall face of the second chamber 132 at the position corresponding to the through hole 16, thereby blocking the working fluid from flowing back to the first chamber 131 from the outlet pipeline 12 and the second chamber 132 via the through hole 16. The way of arranging the valve 8a is the same as the way of arranging the valve 8 in the first chamber 131. The top surface of the cavity 1 is provided with a membrane 2 for covering the first chamber 131 and the second chamber 132 simultaneously. The upper surface of the membrane 2 is provided with an activating element 3 having a fixed end 31 and a swinging end 32. The fixed end 31 is electrically connected with a plurality of electrode leads 4. In the present embodiment, the fixed end 31 is located at the same side as the inlet pipeline 11, thereby facilitating the swinging end 32 of the activating element 3 to swing along an arc-shaped trajectory at one side. Finally, the cavity 1 can be combined with a casing 5, thereby covering the membrane 2 and the activating element 3. Further, the casing is provided with a plurality of penetrating troughs 51 and 51a to correspond to the positions of the swinging end 32 and the fixed end 31 of the activating element 3 respectively. Therefore, the swinging end 32 has a space for expansion, and the electrode leads penetrate into the penetrating trough 51a.

Figure 6:
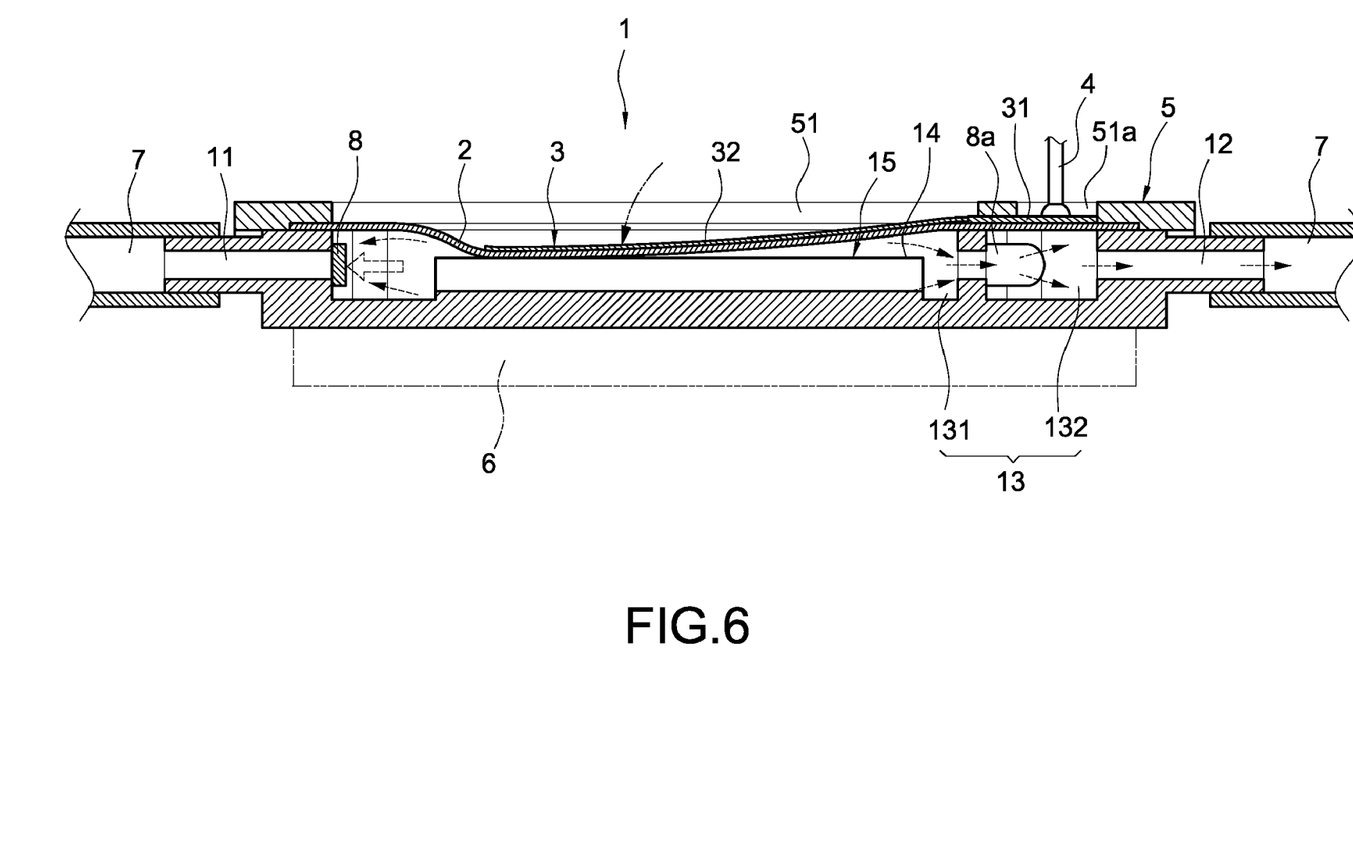
FIG. 6 is a cross-sectional view (I) showing the operation of the second embodiment the present invention.
Figure 7:
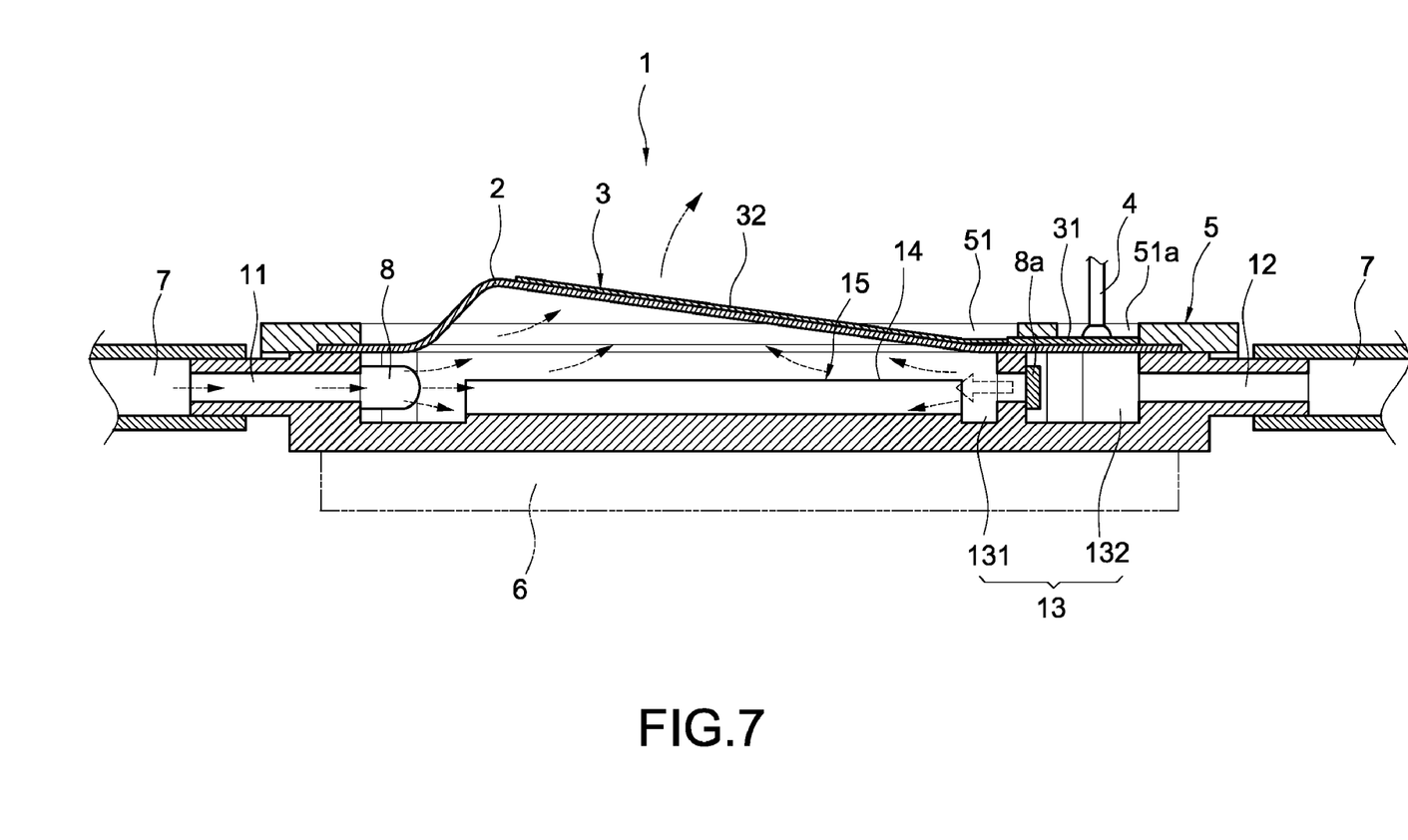
FIG. 7 is a cross-sectional view (II) showing the operation of the second embodiment the present invention.

With reference to FIGS. 6 and 7, they are schematic views showing the operation of the present invention. The water block is adhered onto a heat-generating element 6 and absorbs the heat generated by the heat-generating element. When the activating element 3 on the cavity 1 is supplied with electricity, the swinging end 32 of the activating element 3 can generate a swinging action along an arc-shaped trajectory at one side. When the swinging end 32 swings downwardly, the membrane 2 is driven to compress the internal space of the first chamber 131 to increase the pressure within the first chamber 131. As a result, the working fluid that has performed a heat-exchanging action with the heat-exchanging means 14 in the first chamber 131 can generate a thrust to move along the heat-dissipating pathway 15 toward the inlet pipeline 11 and the outlet pipeline 12 simultaneously. When the working fluid flows toward the inlet pipeline 11, the thrust generated may press the valve 8 located at the position corresponding to the inlet pipeline 11, so that the valve 8 closes the inlet pipeline 11 tightly to avoid the working fluid from entering the inlet pipeline 11 to generate a reflow. At the same time, the working fluid flowing toward the outlet pipeline 12 generates a thrust to push away the valve 8a, so that the working fluid flows toward other components through the second chamber 132. When the activating element 3 swings upwardly, the membrane 2 returns to its original shape to recover the pressure in the first chamber 131, and thus the external pressure is caused to be larger than the internal pressure of the first chamber 131. As a result, the working fluid enters the inlet pipeline 11 to push away the valve 8 and then enters the first chamber 131. Further, the working fluid existing in the second chamber 132 also generates an thrust due to the pressure, thereby pressing the valve 8a located on the through hole 16. Therefore, the valve 8a closes the through hole 16 tightly to block the working fluid from flowing back into the first chamber 131. In this way, the working fluid in the water block can generate a circulation in single direction.

Furthermore, in addition to the left and right sides of the cavity 1, the positions of the inlet pipeline 11 and the outlet pipeline 12 can be changed according to different demands.

Figure 8:
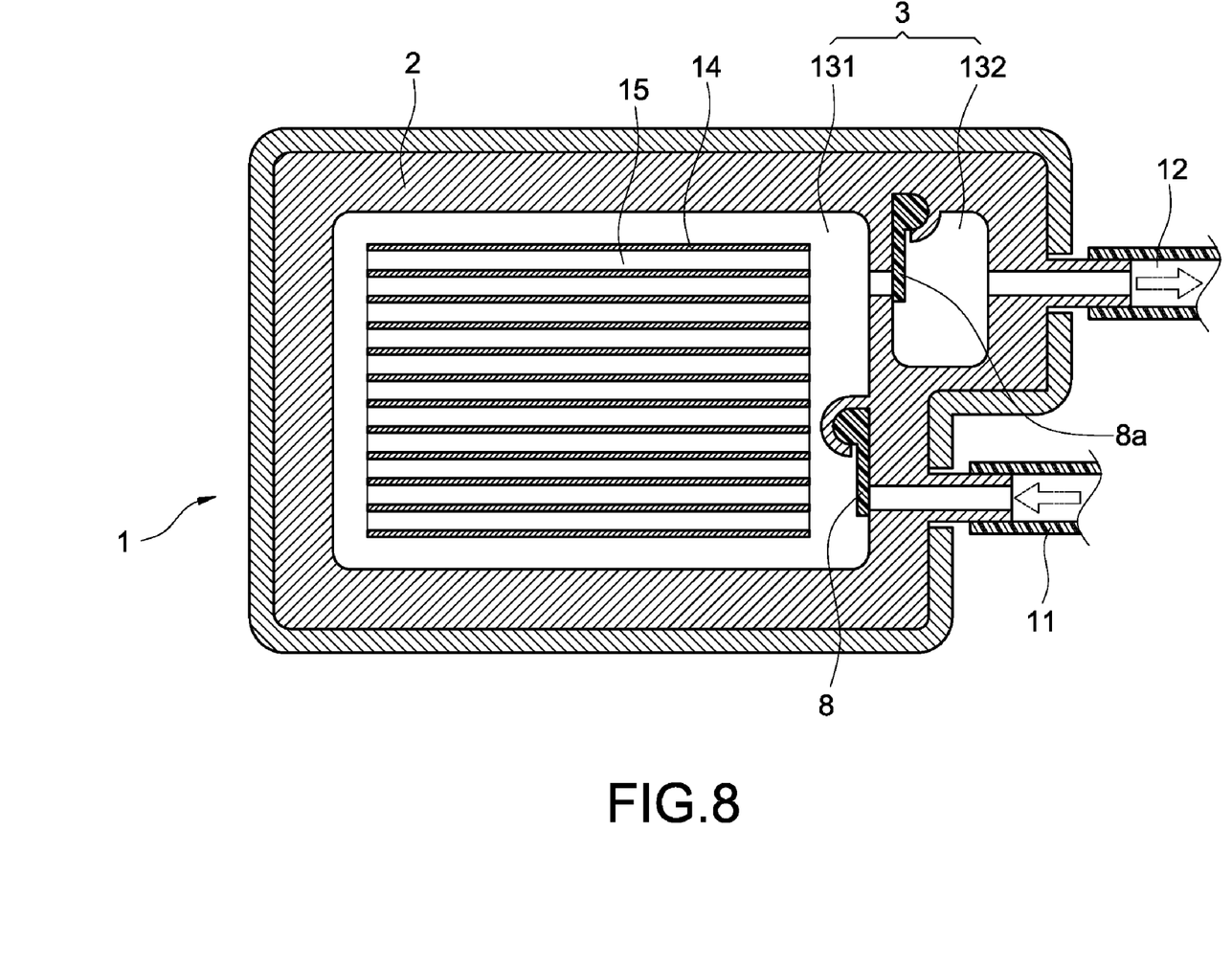
FIG. 8 is a schematic view showing the pipeline of the present invention.

As shown in FIG. 8, the inlet pipeline 11 and the outlet pipeline 12 are provided on the same side of the cavity 1. Via this arrangement, after the water block is adhered to the heat-generating element 6 and performs a heat-exchanging action with the heat generated by the heat-generating element 6, the heat can be absorbed in the water block and then dissipated by the heat-exchanging means 14 in the first chamber 131. Then, the working fluid performs a heat-exchanging action to take the heat away from the water block. After the activating element 3 on the cavity 1 is supplied with electricity, the swinging end 32 of the activating element 3 can generate a swinging action along an arc-shaped trajectory at one side. When the swinging end 32 swings downwardly, the membrane 2 is driven to compress the internal space of the first chamber 131 to increase the pressure within the first chamber 131. As a result, the working fluid that has performed a heat-exchanging action with the heat-exchanging means 14 in the first chamber 131 can generate a thrust to move along the heat-dissipating pathway 15 toward the inlet pipeline 11 and the outlet pipeline 12 simultaneously. When the working fluid flows toward the inlet pipeline 11, the thrust generated may press the valve 8 located at the position corresponding to the inlet pipeline 11, so that the valve 8 closes the inlet pipeline 11 tightly to avoid the working fluid from entering the inlet pipeline 11 to generate a reflow. At the same time, the working fluid flowing toward the outlet pipeline 12 generates a thrust to push away the valve 8a, so that the working fluid flows toward other components through the second chamber 132. When the activating element 3 swings upwardly, the membrane 2 returns to its original shape to recover the pressure in the first chamber 131, and thus the external pressure is caused to be larger than the internal pressure of the first chamber 131. As a result, the working fluid enters the inlet pipeline 11 to push away the valve 8 and then enters the first chamber 131. Further, the working fluid existing in the second chamber 132 also generates a thrust due to the pressure, thereby pressing the valve 8a located on the through hole 16. Therefore, the valve 8a closes the through hole 16 tightly to block the working fluid from flowing back into the first chamber 131. In this way, the working fluid in the water block can generate a circulation in single direction.

Although the present invention has been described with reference to the foregoing preferred embodiments, it will be understood that the invention is not limited to the details thereof. Various equivalent variations and modifications may still occur to those skilled in this art in view of the teachings of the present invention. Thus, all such variations and equivalent modifications are also embraced within the scope of the invention as defined in the appended claims.

What is claimed is:

1. A water block, comprising:
   a cavity having an inlet pipeline and an outlet pipeline thereon, an interior of the cavity having a chamber;
   a heat-exchanging means provided in the chamber for performing a heat-exchanging action with a heat-dissipating fluid;
   a membrane provided on a top of the cavity; and
   an activating element adhered to an upper surface of the membrane, the activating element having a fixed end and a swinging end, the swinging end being movable along an arc-shaped trajectory to change a sectional volume of the cavity;
   wherein the sectional volume of the cavity is changed so that working fluid existing in the cavity enters from the inlet pipeline and exits through the outlet pipeline to generate a flow in single direction,
   wherein the chamber further comprises a first chamber communicating with the inlet pipeline and a second chamber communicating with the first chamber and the outlet pipeline, and
   wherein a through hole is provided between the first chamber and the second chamber.

2. The water block according to claim 1, wherein the cavity is connected to a casing, the casing is provided thereon with a plurality of penetrating troughs corresponding to the fixed end and the swinging end of the activating element respectively.

3. The water block according to claim 2, wherein the fixed end is electrically connected with a plurality of electrode leads.

4. The water block according to claim 3, wherein the plurality of electrode leads penetrates into the corresponding penetrating trough.

5. The water block according to claim 1, wherein the fixed end and the outlet pipeline are located at the same side.

6. The water block according to claim 1, wherein the inlet pipeline and the outlet pipeline are provided at a corresponding position on one side of the cavity.

7. The water block according to claim 1, wherein the inlet pipeline and the outlet pipeline are provided at the same side of the cavity.

8. The water block according to claim 1, wherein the heat-exchanging means is provided in the first chamber.

9. The water block according to claim 1, wherein the second chamber is provided with a penetrating trough on an inner wall adjacent to the through hole, the valve has a pillar and a plate, the pillar penetrates into the penetrating trough, and the plate corresponds to a position of the through hole exactly.

10. The water block according to claim 1, wherein the activating element is a piezoelectric piece.

11. The water block according to claim 1, wherein the heat-exchanging means comprises parallel heat-dissipating fins arranged at intervals.

12. The water block according to claim 11, wherein any two heat-dissipating fins form a heat-dissipating pathway.

13. The water block according to claim 1, wherein the fixed end is electrically connected with a plurality of electrode leads.

14. A water block, comprising:
   a cavity having an inlet pipeline and an outlet pipeline thereon, an interior of the cavity having a chamber;
   a heat-exchanging means provided in the chamber for performing a heat-exchanging action with a heat-dissipating fluid;
   a membrane provided on a top of the cavity; and
   an activating element adhered to an upper surface of the membrane, the activating element having a fixed end and a swinging end, the swinging end being movable along an arc-shaped trajectory to change a sectional volume of the cavity;
   wherein the sectional volume of the cavity is changed so that working fluid existing in the cavity enters from the inlet pipeline and exits through the outlet pipeline to generate a flow in single direction,
   wherein the chamber further comprises a first chamber communicating with the inlet pipeline and a second chamber communicating with the first chamber and the outlet pipeline, and
   wherein the first chamber is provided with a penetrating trough on an inner wall adjacent to the inlet pipeline, the valve has a pillar and a plate, the pillar penetrates into the penetrating trough, and the plate corresponds to a position of the inlet pipeline exactly.

* * * * *